(12) United States Patent
Murakami

(10) Patent No.: US 7,351,291 B2
(45) Date of Patent: Apr. 1, 2008

(54) SEMICONDUCTOR PROCESSING SYSTEM

(75) Inventor: Seishi Murakami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 197 days.

(21) Appl. No.: 10/368,569

(22) Filed: Feb. 20, 2003

(65) Prior Publication Data

US 2003/0155076 A1    Aug. 21, 2003

(30) Foreign Application Priority Data

Feb. 20, 2002  (JP)  .............................. 2002-043484

(51) Int. Cl.
    C23C 16/00      (2006.01)
    H01L 21/306    (2006.01)
    C23F 1/00        (2006.01)
(52) U.S. Cl. ............ 118/719; 156/345.31; 156/345.32; 156/345.29
(58) Field of Classification Search ................ 118/719; 156/345.31, 345.32, 345.29
    See application file for complete search history.

(56) References Cited

U.S. PATENT DOCUMENTS

| 4,798,165 A | * | 1/1989 | deBoer et al. ............... 118/715 |
| 5,391,260 A | * | 2/1995 | Makino et al. ................ 216/69 |
| 5,512,320 A | * | 4/1996 | Turner et al. ........... 427/255.21 |
| 5,792,272 A | * | 8/1998 | van Os et al. ............ 118/723 R |
| 5,934,856 A | * | 8/1999 | Asakawa et al. ............ 414/217 |
| 6,062,798 A | * | 5/2000 | Muka ..................... 414/416.03 |
| 6,176,667 B1 |   | 1/2001 | Fairbairn et al. |
| 6,382,895 B1 | * | 5/2002 | Konishi et al. ............. 414/217 |
| 6,391,114 B1 | * | 5/2002 | Kirimura ..................... 118/719 |
| 6,402,848 B1 | * | 6/2002 | Horiguchi et al. .......... 118/715 |

FOREIGN PATENT DOCUMENTS

| EP | 824 266 A2 | 2/1998 |
| JP | 5-152215 | 6/1993 |
| JP | 7-321178 | 12/1995 |
| JP | 2000-208589 | 7/2000 |
| JP | 2000306851 A | * | 11/2000 |
| WO | WO 200017925 A1 | * | 3/2000 |

* cited by examiner

*Primary Examiner*—Karla Moore
(74) *Attorney, Agent, or Firm*—Oblon, Spivak, McClelland, Maier & Neustadt, P.C.

(57) ABSTRACT

A semiconductor processing system includes a load lock chamber and first to third process chambers connected to an airtight transfer chamber. The second process chamber is disposed below the first process chamber and overlaps with the first process chamber. The third process chamber is disposed at a position laterally distant from the first process chamber and leveled with the first process chamber. First to third exhaust ports are formed in the bottoms of the first to third process chambers, and connected to respective vacuum exhaust sections through first to third exhaust lines. A transfer mechanism is disposed in the transfer chamber to transfer a target substrate to and from the load lock chamber and the first to third process chambers.

13 Claims, 9 Drawing Sheets

SEMICONDUCTOR PROCESSING SYSTEM

This application is based upon and claims the benefit of priority from the prior Japanese Patent Application No. 2002-043484, filed Feb. 20, 2002, the entire contents of which are incorporated herein by reference.

BACKGROUND OF THE INVENTION

1. Field of the Invention

The present invention relates to a semiconductor processing system having a plurality of process chambers each for performing a predetermined semiconductor process in a vacuum atmosphere on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

2. Description of the Related Art

In the process of manufacturing semiconductor devices, a wafer is subjected to various semiconductor processes in vacuum atmospheres, such as film formation, e.g., CVD (Chemical Vapor Deposition), etching, oxidation, diffusion, and annealing. When rapid heating is required in these processes, they are performed on the basis of the concept of RTP (Rapid thermal Processing).

Owing to the demands of increased miniaturization and integration of semiconductor devices, the throughput and yield involving these processes need to be increased. In light of this, there is a semiconductor processing system of the so-called cluster tool type, which has a plurality of process chambers for performing the same process, or a plurality of process chambers for performing different processes, connected to a common transfer chamber (for example, Jpn. Pat. Appln. KOKAI Publication No. 2000-208589). With a semiconductor processing system of the cluster tool type, various steps can be performed in series, without exposing a wafer to air.

FIG. 13 is a plan view schematically showing a conventional processing system of the cluster tool type. As shown in FIG. 13, six vacuum process chambers 12 and two cassette chambers 13 are connected to the sidewall of a transfer chamber 11, which has, e.g., an octagonal shape in plan view. In the transfer chamber 11, there is a transfer machine 14 rotatable and movable back and forth, for transferring a target substrate, e.g., a semiconductor wafer (which will be referred to as a wafer) W.

When wafers W are processed, a wafer cassette C is placed in one of the cassette chambers 13. Then, the transfer machine 14 picks up a wafer W out of the cassette C, and transfers the wafer W into one of the process chambers 12. Where all the process chambers 12 are arranged to perform the same process, wafers W are processed in the process chambers 12 in parallel. Where the process chambers 12 are arranged to perform different processes, a wafer W is subjected to a process in one of the process chambers 12, and then is subjected to another process in another of the process chambers 12. After wafers W have undergone all the necessary processes, they are sequentially returned to the cassette C.

Since this processing system uses a transfer chamber common to a plurality of vacuum processes, the installation space needed is less than that required for vacuum process chambers and transfer chambers connected one by one. In addition, a plurality of wafers W can be subjected to the same process in parallel, or a wafer W can be subjected to a plurality of processes in series, thereby attaining a high throughput.

BRIEF SUMMARY OF THE INVENTION

As described later, the conventional processing system of the cluster tool type gives rise to problems that hinder space efficiency being increased, in light of demands of the next generation, such as an increase in wafer size. An object of the present invention is to improve the throughput and so forth of a processing system including a plurality of vacuum process chambers connected to a transfer chamber.

According to a first aspect of the present invention, there is provided a semiconductor processing system comprising:

a pressure-adjustable airtight transfer chamber;

a pressure-adjustable load lock chamber connected to an in/out port of the transfer chamber through a gate valve, and configured to insert/receive a target substrate into/from the transfer chamber;

a pressure-adjustable first process chamber connected to a first port of the transfer chamber through a gate valve, and configured to subject a target substrate to a semiconductor process in a vacuum atmosphere;

a pressure-adjustable second process chamber connected to a second port of the transfer chamber through a gate valve, and configured to subject a target substrate to a semiconductor process in a vacuum atmosphere, the second process chamber being disposed below the first process chamber and overlapping with the first process chamber;

a pressure-adjustable third process chamber connected to a third port of the transfer chamber through a gate valve, and configured to subject a target substrate to a semiconductor process in a vacuum atmosphere, the third process chamber being disposed at a position laterally distant from the first process chamber, the third port being substantially leveled with the first port or the second port;

first to third exhaust lines respectively connecting first to third exhaust ports formed in bottoms of the first to third process chambers to corresponding vacuum exhaust sections; and a transfer mechanism disposed in the transfer chamber, and configured to transfer a target substrate to and from the load lock chamber and the first to third process chambers.

According to a second aspect of the present invention, there is provided a semiconductor processing system comprising:

a pressure-adjustable airtight transfer chamber;

a pressure-adjustable load lock chamber connected to an in/out port of the transfer chamber through a gate valve, and configured to insert/receive a target substrate into/from the transfer chamber;

a pressure-adjustable first process chamber connected to a first port of the transfer chamber through a gate valve, and configured to subject a target substrate to a semiconductor process in a vacuum atmosphere;

a pressure-adjustable second process chamber connected to a second port of the transfer chamber through a gate valve, and configured to subject a target substrate to a semiconductor process in a vacuum atmosphere, the second process chamber being disposed below the first process chamber and overlapping with the first process chamber, the second process chamber having a center shifted from that of the first process chamber in a first horizontal direction along an outer surface of a sidewall of the transfer chamber, such that a first offset space is formed below the first process chamber and beside an adjacent sidewall of the second process chamber, and has a width larger than a first value and smaller than a half of a width of the first process chamber in the first horizontal direction;

first and second exhaust lines respectively connecting first and second exhaust ports formed in bottoms of the first and second process chambers to corresponding vacuum exhaust sections, the first exhaust line extending downward through the first offset space and having a width of the first value in the first horizontal direction; and a transfer mechanism disposed in the transfer chamber, and configured to transfer a target substrate to and from the load lock chamber and the first and second process chambers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 13:
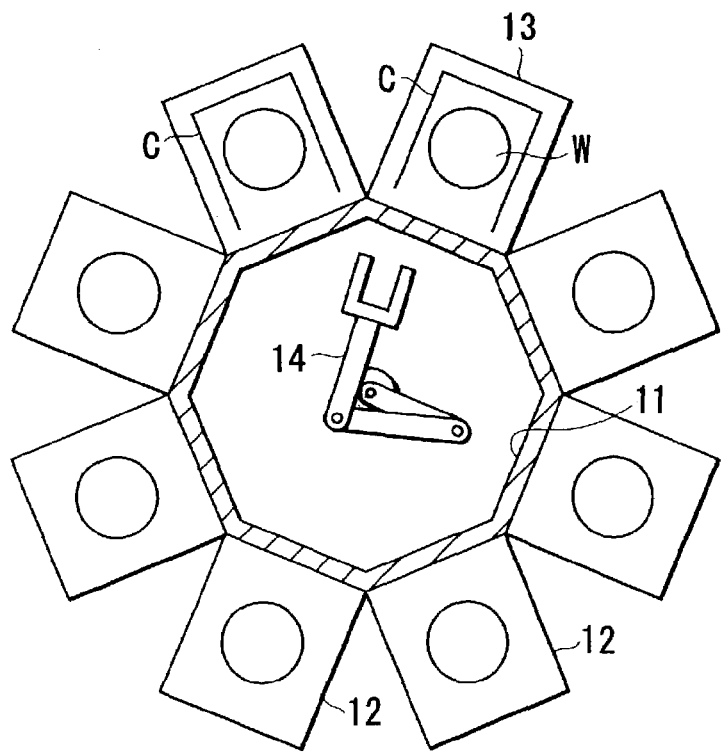
FIG. 13 is a plan view schematically showing a conventional processing system of the cluster tool type.

In the process of developing the present invention, the inventor studied problems caused in conventional processing systems of the cluster tool type, as shown in FIG. 13. As a result, the present inventor has arrived at the finding given below.

Specifically, in general, semiconductor processing systems are disposed in a clean room maintaining a high cleanliness. The clean room entails a high running cost per unit area, and thus the processing systems are preferably more compact to reduce the cost. In recent years, as the degree of integration of semiconductor devices increases, the number of vacuum process chambers in one processing system has been increased, in order to accommodate an increasing number of processing steps or to further improve the throughput. Furthermore, as wafers are larger, the vacuum process chambers are also larger. Accordingly, in consideration of demands of the next generation, it is likely that the installation space needed for the processing system shown in FIG. 13 will greatly increase.

On the other hand, there has been proposed a semiconductor processing system in which a plurality of vacuum process chambers are stacked in a vertical direction, and connected to a common transfer chamber (for example, Jpn. Pat. Appln. KOKAI Publication Nos. 5-152215 and 7-321178, EP 824 266 A2, and U.S. Pat. No. 6,176,667 B1). In Jpn. Pat. Appln. KOKAI Publication No. 5-152215 and EP 824 266 A2, a processing system has a transfer machine disposed in a transfer chamber, movable up and down and back and forth, so as to transfer wafers independently into process chambers. In Jpn. Pat. Appln. KOKAI Publication No. 7-321178 and U.S. Pat. No. 6,176,667 B1, a processing system includes a transfer machine disposed in a transfer chamber, to transfer wafers into process chambers together at the same time.

In a processing system of this type, in which a plurality of vacuum process chambers are stacked in a vertical direction and connected to a common transfer chamber, the layout of an exhaust system for vacuum-exhausting the process chambers suffers some restriction. The restriction makes it difficult to form a uniform flow of a process gas in each of the process chambers, thereby lowering the planar uniformity of a process on a wafer. This problem becomes more prominent, if the vacuum process chambers are increased in size, as would be necessary for lager wafers.

Embodiments of the present invention achieved on the basis of the findings given above will now be described with reference to the accompanying drawings.

Figure 1:
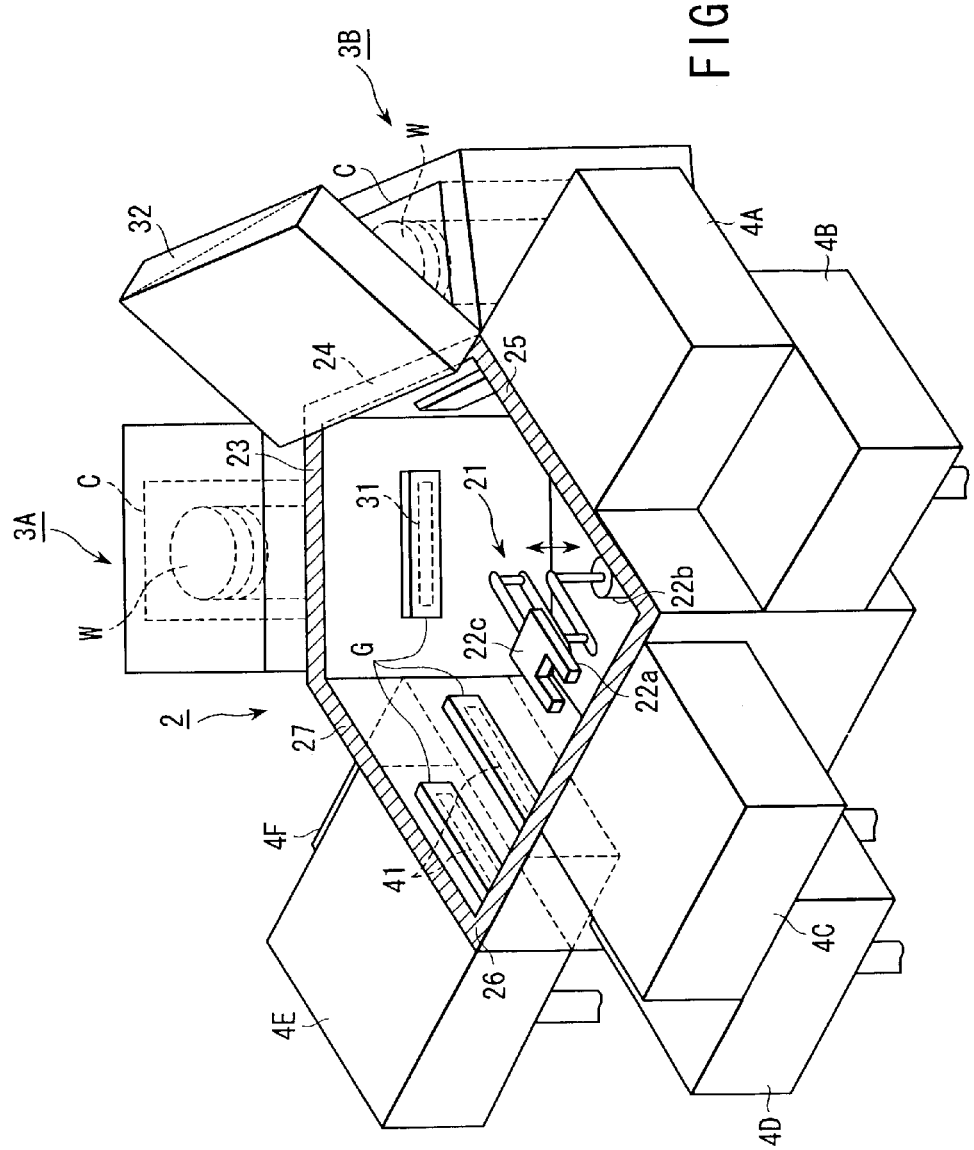
FIG. 1 is a partially cutaway perspective view showing a semiconductor processing system according to an embodiment of the present invention.
Figure 2:
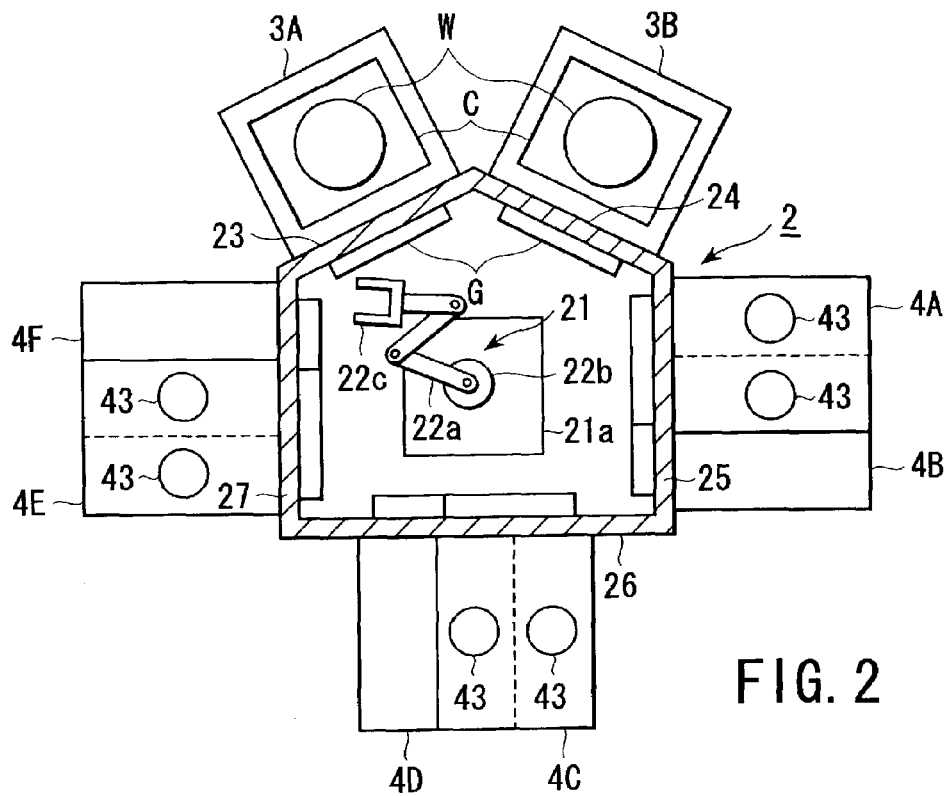
FIG. 2 is a partially cutaway plan view of the semiconductor processing system shown in FIG. 1.

FIGS. 1 and 2 are a partially cutaway perspective view and a partially cutaway plan view, respectively, showing a semiconductor processing system according to an embodiment of the present invention.

This processing system includes a vacuum transfer chamber 2, which has a pentagonal shape in plan view, and is airtight and pressure-adjustable. Two load lock chambers 3A and 3B, and six vacuum process chambers 4A to 4F are connected to the sidewall of the transfer chamber 2. In the transfer chamber 2, there is a transfer machine 21 for transferring a target substrate or semiconductor wafer W to and from the load lock chambers 3A and 3B, and vacuum process chambers 4A to 4F.

The transfer machine 21 includes an articulated arm 22a, which is rotatable, and movable up and down and back and forth, and a driving mechanism 22b for driving the arm 22a to perform these movements. The driving mechanism 22b is disposed on an X-Y stage 21*a* for moving it in horizontal directions. The arm 22*a* is provided with a pick 22*c* at the distal end, for vacuum-chucking the bottom of a wafer W to hold it horizontally.

The transfer chamber 2 is formed of an airtight casing, which is defined by a top wall (ceiling) and bottom wall (floor), and five sidewalls 23 to 27. The ceiling of the transfer chamber 2 is provided with a window (not shown) of, e.g., a glass plate, so that the inside is visible. The transfer chamber 2 is connected to a supply section of an inactive gas (not shown) through a supply line, and to a vacuum exhaust section (not shown) through an exhaust line. These members allow the transfer chamber 2 to be pressure-adjustable.

The load lock chambers 3A and 3B are airtightly connected to the sidewalls 23 and 24 of the transfer chamber 2, each for adjusting the pressure between an atmospheric pressure side and a vacuum side. The sidewalls 23 and 24 of the transfer chamber 2 are provided with ports 31 formed therein and respectively opened to the load lock chambers 3A and 3B to allow a wafer W to pass therethrough. A gate valve G is arranged on each of the ports 31 to airtightly open/close it. Since the load lock chambers 3A and 3B have substantially the same structure, only the load lock chamber 3A will be explained, for example.

The load lock chamber 3A is formed of a cassette chamber for accommodating a cassette C, in which, e.g., 25 wafers W can be stacked one on the other with a gap therebetween in a vertical direction. The cassette C is inserted through an opening, which is formed at the top of the load lock chamber 3A, and provided with a lid 32 to open/close it. Then, the cassette C is placed on a table movable up and down disposed in the load lock chamber 3A. The load lock chamber 3A is connected to a supply section of an inactive gas (not shown) through a supply line, and to a vacuum exhaust section (not shown) through an exhaust line. These members allow the load lock chamber 3A to be pressure-adjustable.

In this embodiment, the load lock chambers 3A and 3B are cassette chambers, but they may be load lock chambers of other types, as described later. Typically, each of the load lock chambers may be a buffer chamber connecting the transfer chamber 2 on the vacuum side to a transfer chamber on an atmosphere side. In this case, the load lock chamber may be provided with such a member therein as a rack or table for placing one or more wafers for a while, or a mechanism for heating or cooling a wafer.

The vacuum process chambers 4A to 4F are airtightly connected to the sidewalls 25, 26, and 27 of the transfer chamber 2, each for subjecting a wafer W to a semiconductor process in a vacuum atmosphere. Of the process chambers 4A to 4F, a pair of upper and lower process chambers overlap with each other and are disposed on each of the sidewalls 25, 26, and 27. Each of the vacuum process chambers 4A to 4F is connected to a supply section of a process gas and inactive gas through a supply line, and to a vacuum exhaust section through an exhaust line, as described later. These members allow each of the vacuum process chambers 4A to 4F to be pressure-adjustable.

The sidewalls 25, 26, and 27 of the transfer chamber 2 are provided with ports 41 formed therein and respectively opened to the process chambers 4A to 4F to allow a wafer W to pass therethrough. A gate valve G is arranged on each of the ports 41 to airtightly open/close it. The ports 41 to the upper process chambers 4A, 4C, and 4E are formed at the same level as each other. The ports 41 to the lower process chambers 4B, 4D, and 4F are formed at the same level as each other, and at the same level as the ports 31 to the load lock chambers 3A and 3B.

In this embodiment, the sidewalls 25 to 27 have the same dimensions as each other, and the process chambers 4A to 4F connected thereto have the same dimensions as each other. In addition, the pairs of the process chambers 4A to 4F are connected to the sidewalls 25, 26, and 27 in the same manner (e.g., a positions at which a process chamber is connected to the corresponding sidewall) as each other. As described later, there is a gap between the upper process chambers 4A, 4C, and 4E, and the corresponding lower process chambers 4B, 4D, and 4F. However, the gap is not shown in some figures, for the sake of convenience.

Each of the process chambers 4A to 4F has an interior structure suitable for a semiconductor process, such as film formation, etching, oxidation, diffusion, or annealing. As an example, an explanation will be given of the process chambers 4A and 4B connected to the sidewall 25 for performing film formation.

Figure 3:
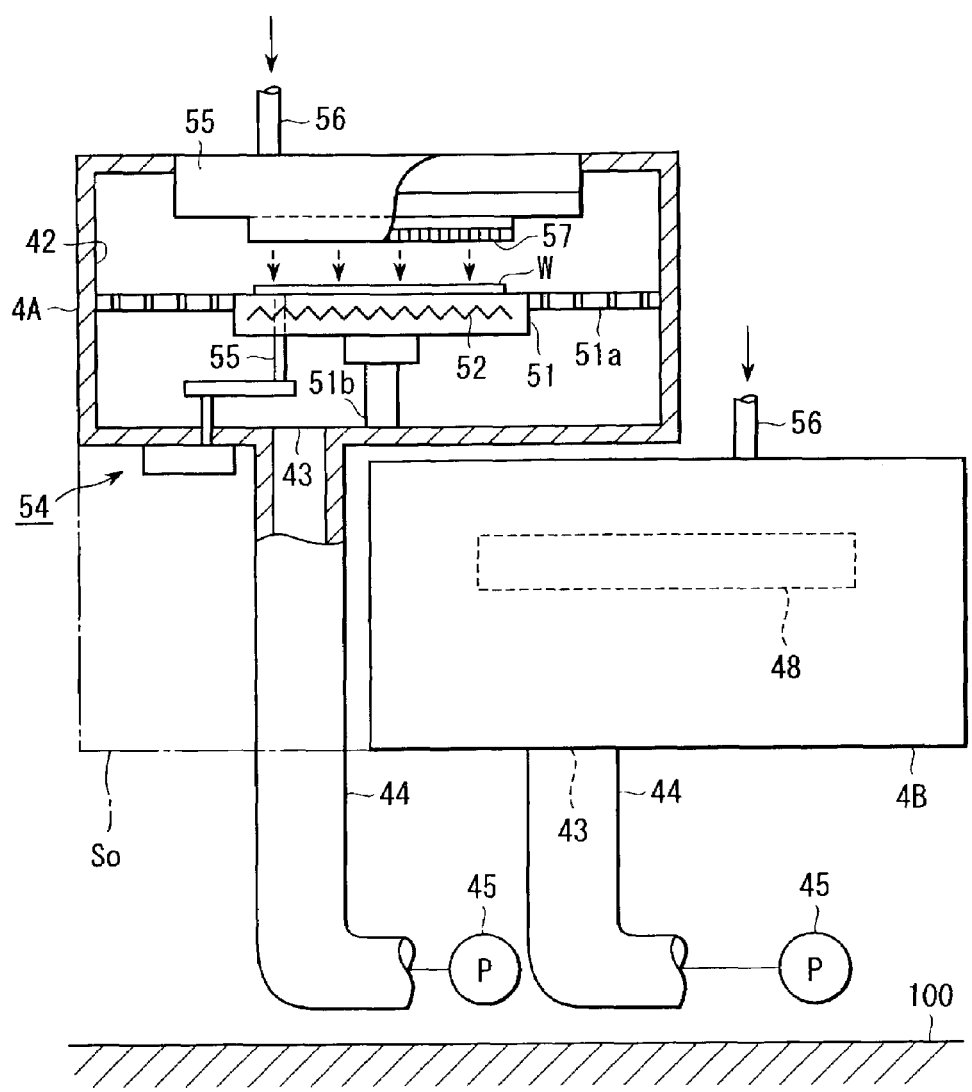
FIG. 3 is a partially cutaway side view showing two process chambers, in the semiconductor processing system shown in FIG. 1.

FIG. 3 is a partially cutaway side view showing the process chambers 4A and 4B. In the process chamber 4A, a circular worktable 51 is disposed for placing a wafer W thereon. An electrostatic chuck (not shown) is disposed on the top of the worktable 51, for holding the wafer W. A heater 52 is built in the worktable 51, for heating the wafer W from below. Furthermore, a thermo-sensor (not shown) is embedded in the worktable 51.

A baffle plate 51*a* is interposed between the worktable 51 and the inner wall of the process chamber 4A, for causing gas to be uniformly exhausted around the wafer W, thereby forming a uniform flow of a process gas. The bottom of the worktable 51 is supported by a cylindrical column 51*b*. Utility lines (not shown) are led through the column 51*b* from the inside of the process chamber 4A to the outside. For example, the utility lines include a power supply line to the heater 52, a signal line from the thermo-sensor, and a feed line to the electrostatic chuck.

Lifter pins 53 (only one of them is shown in FIG. 3) are provided to be movable up and down through the worktable 51. The lifter pins 53 are connected through a common frame to a driving source 54, which is fixed to the outside of the bottom of the process chamber 4A. The lifter pins 53 project upward from the worktable 51 when the wafer is loaded/unloaded, so that the wafer can be transferred between them and the pick 22*c* of the transfer machine 21.

A showerhead 55 is attached to the ceiling of the process chamber 4A and faces the worktable 51. The top of the showerhead 55 is connected to a supply section of a reactive gas (for example, a film formation gas for a CVD process) and an inactive gas (for example, nitrogen) through a gas supply line 56. A reservoir is formed in the showerhead 55, and communicates with the gas supply line 56. The reservoir is provided with diffusion plates therein. A number of gas delivery holes 57 are formed in the bottom of the showerhead 55, for uniformly supplying gas from the reservoir toward the wafer W. The top side of the showerhead 55 can be opened/closed to facilitate maintenance of the inside.

Figure 4:
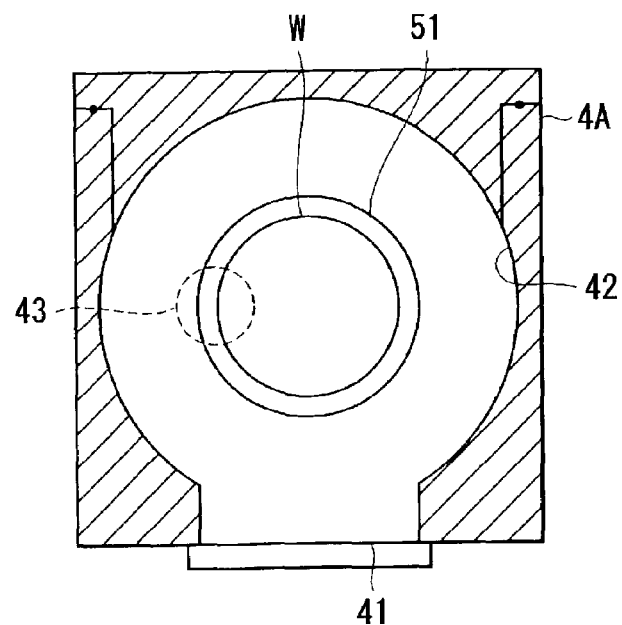
FIG. 4 is a sectional plan view showing the relationship between the casing of a process chamber and a worktable, in the semiconductor processing system shown in FIG. 1.

FIG. 4 is a sectional plan view showing the relationship between the casing of the process chamber 4A and the worktable 51. As shown in FIG. 4, the process chamber 4A has a rectangular appearance and a circular interior wall 42. This structure has been determined in light of the flow or the like of the gas supplied from the showerhead 55. The interior wall 42 has a flat portion on the port 41 side. The top side and/or lateral side of the process chamber 4A can be opened/closed. Accordingly, for example, when the showerhead 55 is subjected to a maintenance operation, it can be detached from the process chamber 4A, and subjected to the operation outside the processing system.

An exhaust port 43 is formed in the bottom of the process chamber 4A, at a position, e.g., 100 to 500 mm distant from the center of the circle of the interior wall 42, i.e., the center of the worktable 51. The exhaust port 43 is connected to a vacuum pump 45 in a vacuum exhaust section through an exhaust line 44 having a diameter of, e.g., 30 to 200 mm. The exhaust line 44 is provided with a valve and mass-flow controller (not shown). When the process chamber 4A is supplied with a process gas, the process chamber 4A is also exhausted, while a control section (not shown) adjusts the valve and mass-flow controller on the exhaust line 44. As a consequence, the atmosphere in the process chamber 4A is kept at a predetermined vacuum level.

The exhaust line 44 extends vertically downward from the exhaust port 43 toward the punching floor of a clean room 100 (see FIG. 3). The exhaust line 44 is bent to be horizontal at a position corresponding to the height of a vacuum pump 45 disposed on the floor of the clean room 100, and then is connected to the vacuum pump 45. The vacuum pump 45 may be disposed not within the clean room 100, but below the floor of the clean room 100. In this case, the exhaust line 44 may pass through the floor of the clean room 100.

On the other hand, although the interior structure of the process chamber 4B is not shown, it may be substantially the same as that of the process chamber 4A, or may be a structure for performing another process, such as etching, oxidation, diffusion, or annealing. In the example shown in FIG. 3, however, it is assumed that the process chamber 4B has substantially the same interior structure as that of the process chamber 4A. In this case, the exhaust port 43 of the process chamber 4B is preferably located at substantially the same position as that of the exhaust port 43 of the process chamber 4A, in order to make their exhaust characteristics equal.

Explanation will be given of the layout of the pair of process chambers 4A and 4B. As shown in FIGS. 1 to 3, the center of the process chamber 4B is shifted from the center of the process chamber 4A in a horizontal direction along the outer surface of the sidewall 25 of the transfer chamber 2. As a consequence, an offset space So is formed below the process chamber 4A and beside the adjacent sidewall of the process chamber 4B. In this embodiment, the offset space So has a width larger than the width of the exhaust line 44 extending from the process chamber 4A and smaller than a half of the width of the process chamber 4A, in the horizontal direction.

The exhaust port 43 of the process chamber 4A is disposed directly above the offset space So, and the exhaust line 44 therefrom extends vertically downward through the offset space So. In other words, the exhaust port 43 of the process chamber 4A is formed in the bottom of the chamber 4A at a position eccentric with the bottom. The lower process chamber 4B is disposed at a position where it does not obstruct the exhaust port 43 of the upper process chamber 4A, but is adjacent to the exhaust line 44 connected to this exhaust port 43. On the other hand, the exhaust port 43 of the process chamber 4B is formed at the same position as the exhaust port 43 of the upper process chamber 4A, and is connected to an exhaust line 44 extending vertically downward.

The exhaust lines 44 of the process chambers 4A and 4B are designed to have the same number of bent portions thereon, from their proximal ends to the respective vacuum pumps 45. This arrangement allows the exhaust lines 44 of the process chambers 4A and 4B to have a conductance similar to each other. If necessary, the conductance can be adjusted by some modification, such as forming a curved portion on the shorter exhaust line 44.

Figure 5:
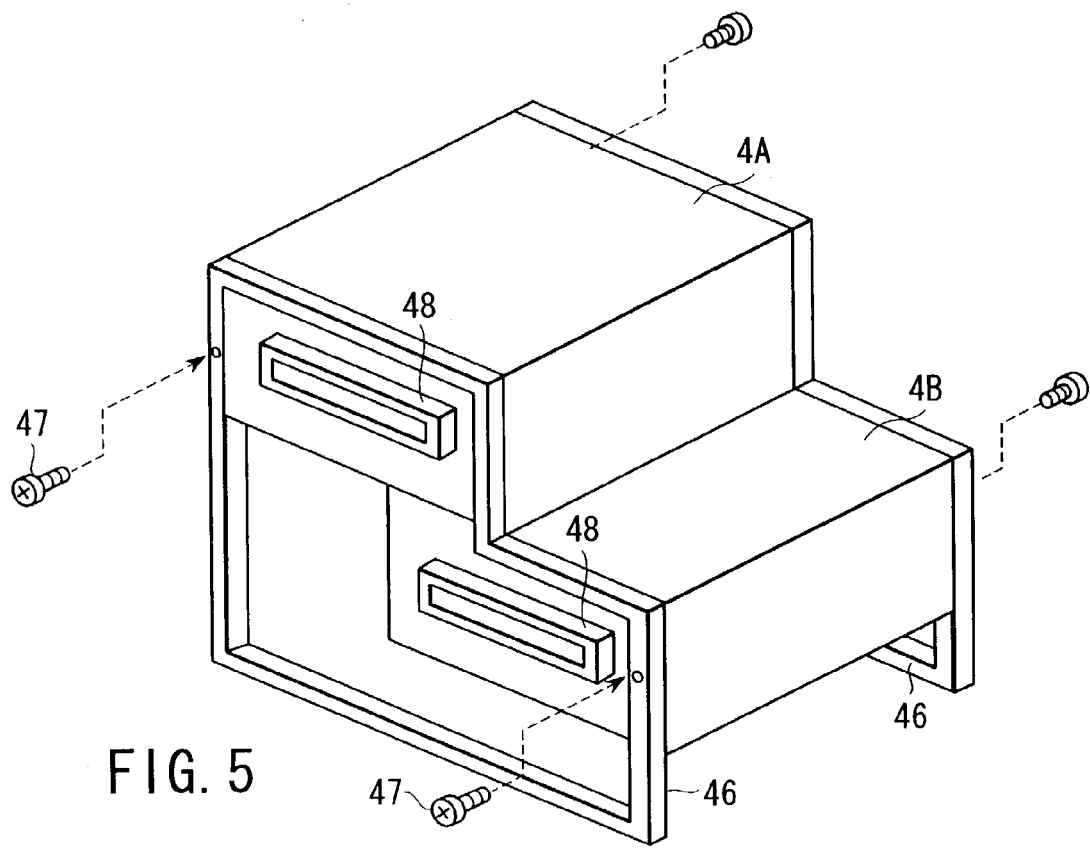
FIG. 5 is a perspective view showing an example of arrangement of process chambers, in the semiconductor processing system shown in FIG. 1.

FIG. 5 is a perspective view showing an example of an arrangement of the process chambers 4A and 4B. As shown in FIG. 5, the process chambers 4A and 4B are respectively defined by independent casings, and fixed to a pair of frame members 46 by bolts 47. The process chambers 4A and 4B thus fixed are then airtightly connected to the sidewall 25, such that openings 48 formed in their front respectively align with the corresponding ports 41 described above. In FIGS. 1 and 5, a gap formed in a vertical direction between a pair of process chambers (such as process chambers 4A and 4B) is not shown for the sake of convenience. The process chambers 4A and 4B may be fixed to independent support bases by their bottoms.

An explanation will be given of an operation of the semiconductor processing system according to this embodiment.

First, a cassette C storing, e.g., 25 wafers W is loaded into each of the load lock chambers 3A and 3B. Then, the lids 32 are closed, and the load lock chambers 3A and 3B are vacuum-exhausted to a vacuum level almost the same as that in the transfer chamber 2. Then, the gate valve G of, e.g., the load lock chamber 3A is opened, and a wafer W in the cassette C is picked up by the pick 22c of the transfer machine 21. Then, the wafer W is transferred into, e.g., the process chamber 4A, and placed on the worktable 51 by the transfer machine 21. Similar operations are repeated, so that other wafers W in the cassette C are transferred into the other process chambers 4B to 4F. Then, the wafers W are subjected to a semiconductor process in the process chambers 4 (4A to 4F) in parallel.

For example, in the process chamber 4A, the gate valve G is closed, and the wafer W is heated up to a predetermined temperature by the heater 52, while the process chamber 4A is vacuum-exhausted to set the inside atmosphere at a predetermined vacuum level. Then, for example, $TiCl_4$ gas and $NH_3$ gas used as film formation gases are supplied from the showerhead 55, while the process chamber 4A is vacuum-exhausted. The process gas causes a chemical vapor reaction by thermal energy, thereby forming a TiN thin film over the surface of the wafer W. After the wafers W are processed in the process chambers 4A to 4F, they are returned in the cassette C in the load lock chamber 3A.

As described above, the semiconductor processing system according to this embodiment has a structure in which every two of the process chambers 4A to 4F are paired and set at two height levels, and the pairs of upper and lower process chambers 4 are disposed around the transfer chamber 2. This arrangement greatly improves the space efficiency, and reduces the installation space in a clean room, resulting in a decrease in the running cost of the clean room. The exhaust port 43 deviates from the center of the upper process chamber 4A, and thus the overlapping portion of the process chamber 4A with the process chamber 4B can be wider. As a consequence, it is possible to improve the space efficiency, while securing a maintenance operation space.

Each pair of process chambers (for example, the process chambers 4A and 4B) are stacked while they are laterally shifted from each other. Accordingly, there is no part of the lower process chamber 4B below the shifted part of the upper process chamber 4A, thereby facilitating maintenance thereon. Specifically, during maintenance, an operator needs to perform operations, such as detaching the column 51b of the worktable 51 in a process chamber, from around the process chambers 4A to 4F. At this time, the offset space So formed below each of the upper process chambers 4A, 4C, and 4E makes the operations easier.

Furthermore, the exhaust port 43 of the process chamber 4A is disposed directly above the offset space So, and the exhaust line 44 therefrom extends vertically downward through the offset space So. Accordingly, the exhaust line 44 can extend, without any bent portion, to a position corresponding to the height of the vacuum pump 45 disposed on the floor of the clean room, thereby increasing the exhaust conductance. In other words, the internal pressure of each process chamber can be lower, as compared to a conventional processing system including an exhaust line with several bent portions. It means that, for example, each process chamber can be kept at a higher vacuum level without using a larger vacuum pump. In addition, the flow rate of gas (or gas load) can be advantageously increased.

Figure 7:
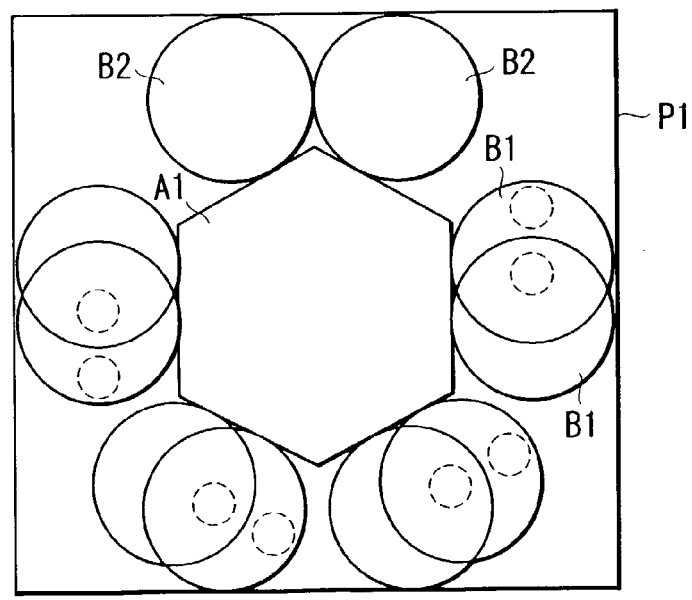
FIGS. 6A, 6B, and 7 are plan views schematically showing how the embodiment of the present invention is effective over the prior art, where load lock chambers and process chambers have the same common size (bottom area)
Figure 6A:
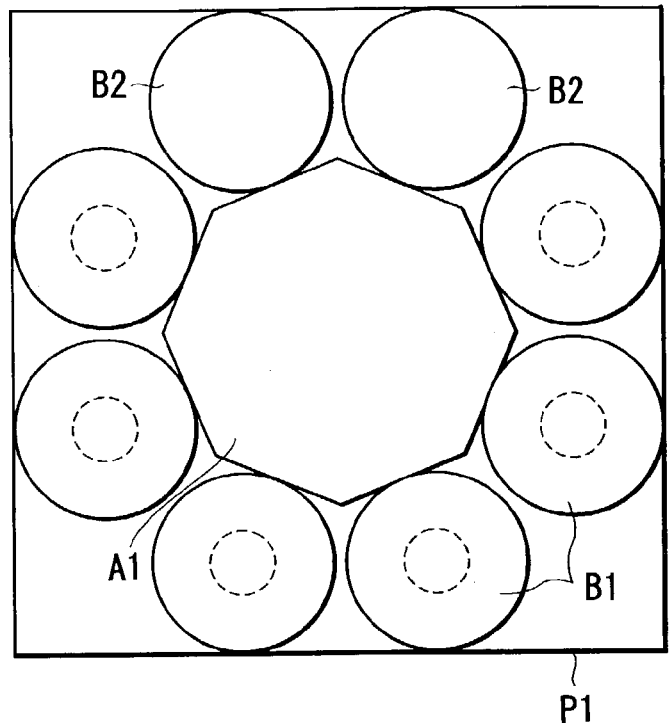
Figure 6B:
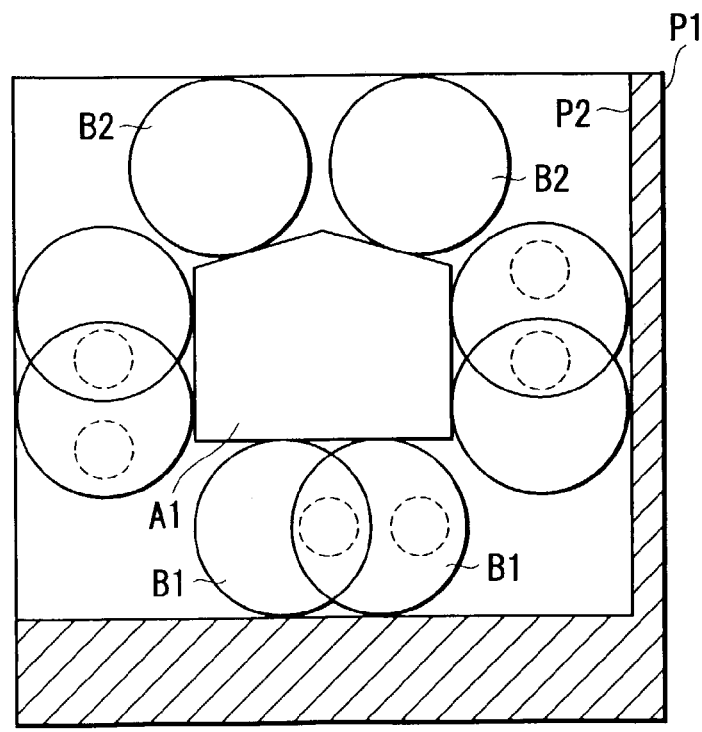

FIGS. 6A, 6B, and 7 are plan views schematically showing how this embodiment is effective over the prior art, where load lock chambers and process chambers have the same common size (bottom area). An explanation will be given of effects of this embodiment visually with reference to these figures. In the figures, the plan view contours of the load lock chambers and process chambers are shown with circles for the sake of convenience, and the positions of the exhaust ports of the process chambers are shown with small circles of broken lines, for reference.

The line of a rectangular contour P1 shown in FIG. 6A denotes the necessary size to accommodate six process chambers B1 and two load lock chambers B2, which are densely disposed around a transfer chamber A1, on one plane. The rectangular contour P1 corresponds to the area occupied by the conventional processing system shown in FIG. 13. On the other hand, an inner rectangular contour P2 shown in FIG. 6B shows an installation space where the same number of process chambers B1 and load lock chambers B2 as FIG. 6A are disposed in accordance with this embodiment. As is clearly understood from the area with hatching sandwiched between lines P1 and P2 in FIG. 6B, this embodiment remarkably reduces the installation space (or footprint), and specifically reduces the necessary space by 25% or more.

Where a plurality of, e.g., six, process chambers B1 are disposed relative to a transfer chamber A1, an increase in size of the process chambers B1 requires the transfer chamber A1 to increase in size that much. Besides, in consideration of maintenance area or the like, the transfer chamber A1 needs to further increase in size. As a consequence, the area defined by the rectangular contour P1 of the conventional system greatly increases. On the other hand, according to this embodiment, the same number of process chambers B1 are disposed at upper and lower levels with an offset therebetween, so that, as indicated by the rectangular contour P2 shown in FIG. 6B, these process chambers B1 are accommodated in the transfer chamber A1 without changing the size of the transfer chamber A1 so much, thereby saving space.

FIG. 7 shows how many process chambers B1 can be disposed in the rectangular contour (installation space) P1 of the conventional processing system shown in FIG. 6A. As shown in FIG. 6A, only six process chambers B1 can be disposed in accordance with the conventional technique, while, as shown in FIG. 7, eight process chambers B1 can be disposed in accordance with this embodiment. In other words, the accommodation capacity for process chambers B1 increases by 20% or more.

Figure 8:
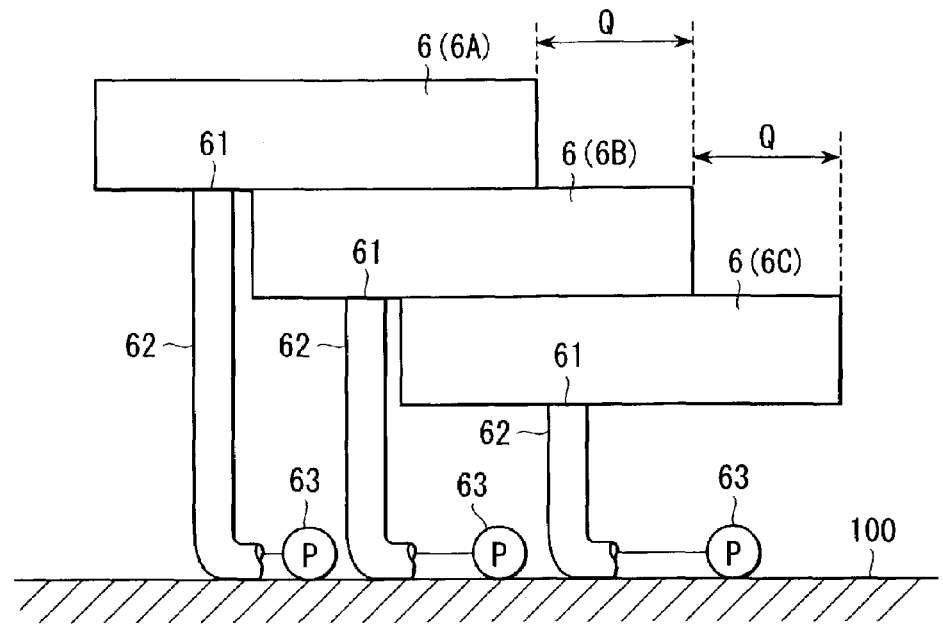
FIGS. 8, 9, and 10 are side views respectively showing parts of semiconductor processing systems according to other embodiments of the present invention.
Figure 9:
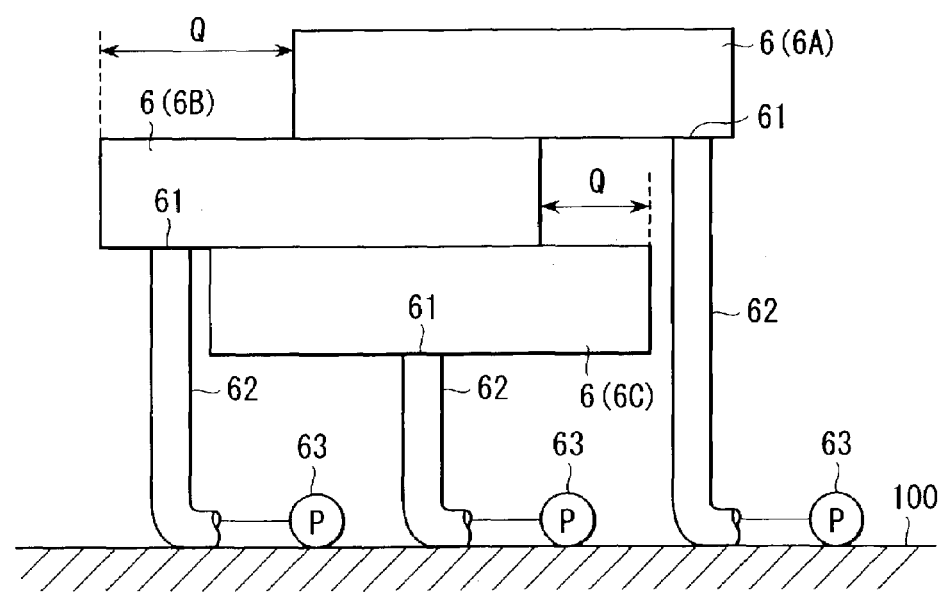

FIGS. 8 and 9 are side views respectively showing parts of semiconductor processing systems according to other embodiments of the present invention. The group of process chambers connected to each sidewall of a transfer chamber 2 is not limited to being formed of two process chambers at two height levels, but may be three or more process chambers at three or more height levels. In the embodiments shown in FIGS. 8 and 9, the group of process chambers connected to each sidewall of the transfer chamber 2 is formed of three process chambers 6A to 6C having the same size and disposed at three height levels. Between the process chambers 6A to 6C, an arbitrary offset width Q is secured in a horizontal direction along the sidewall of the transfer chamber. The offset width Q may be larger than the width of an exhaust line extending from the upper process chamber 6 and smaller than a half of the width of the upper process chamber 6, as described above.

In the embodiment shown in FIG. 8, the process chambers 6A to 6C are disposed at different height levels, while the offset from the chamber 6A to the chamber 6B, and the offset from the chamber 6B to the chamber 6C are made in the same direction. In the embodiment shown in FIG. 9, the process chambers 6A to 6C are disposed at different height levels, while the offset from the chamber 6A to the chamber 6B, and the offset from the chamber 6B to the chamber 6C are made in opposite directions. According to the embodiment shown in FIG. 9, the footprint of the processing system further decreases.

Also in the embodiments shown in FIGS. 8 and 9, each of the process chambers 6 is provided with an exhaust port 61 formed in the bottom. The position of the exhaust port 61 in the bottom is preferably located not to overlap with the lower process chamber 6. Then, the exhaust line 62 connected to the exhaust port 61 can extend, without any bent portion, to a position corresponding to the height of a vacuum exhaust section 63 disposed, e.g., on the floor of a clean room 100.

Figure 10:
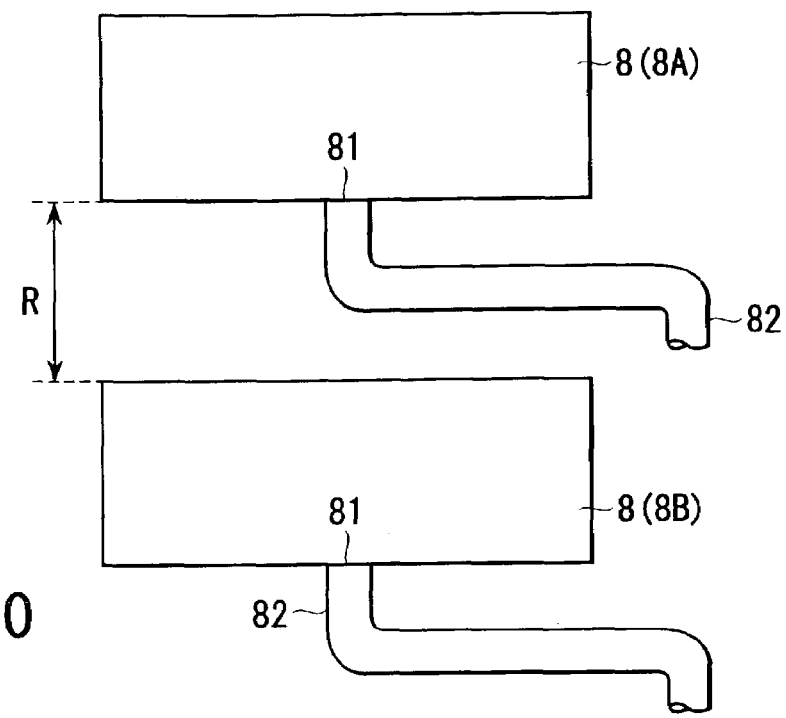

FIG. 10 is a side view showing a part of a semiconductor processing system according to still another embodiment of the present invention. In the embodiment shown in FIG. 10, the group of process chambers connected to each sidewall of a transfer chamber 2 are formed of two process chambers 8A and 8B having the same size and disposed at two height levels. Between the process chambers 8A and 8B, there is no offset in a horizontal direction along the sidewall of the transfer chamber. In other words, the process chambers 8A and 8B are disposed to have their plan view contours completely overlap with each other. However, a gap R two times or more, and preferably three times or more, the diameter of an exhaust line 82 is secured between the process chambers 8A and 8B in a vertical direction.

Each of the process chambers 8A and 8B is provided with an exhaust port 81 formed in the bottom at the center. The exhaust line 82 of the upper process chamber 8A extends horizontally in the gap R, and then extends vertically downward at a position outside the lower process chamber 8B. The exhaust line 82 of the upper process chamber 8B extends horizontally, and then extends vertically downward, in a manner almost the same as that of the exhaust line 82 of the upper process chamber 8A. This arrangement allows the exhaust lines 82 of the process chambers 8A and 8B to have a conductance similar to each other.

According to the embodiment shown in FIG. 10, since the exhaust port 81 is located at the center of each of the process chambers 8A and 8B, the process chamber can be uniformly exhausted without any baffle plate disposed therein, and thus a uniform flow of a process gas can be easily formed in the process chamber. For example, in CVD, there is a case where a film formation process is performed at a pressure higher than $1.33322 \times 10^2$ Pa (1 Torr), in accordance with the required conditions. Even in this case, there is hardly any fear that a viscous flow occurs in the process chamber 8. In addition, since there is a gap R secured in the vertical direction with no offset between the stacked process chambers 8, the necessary space can further decrease, as compared to the other embodiments described above.

Figure 11:
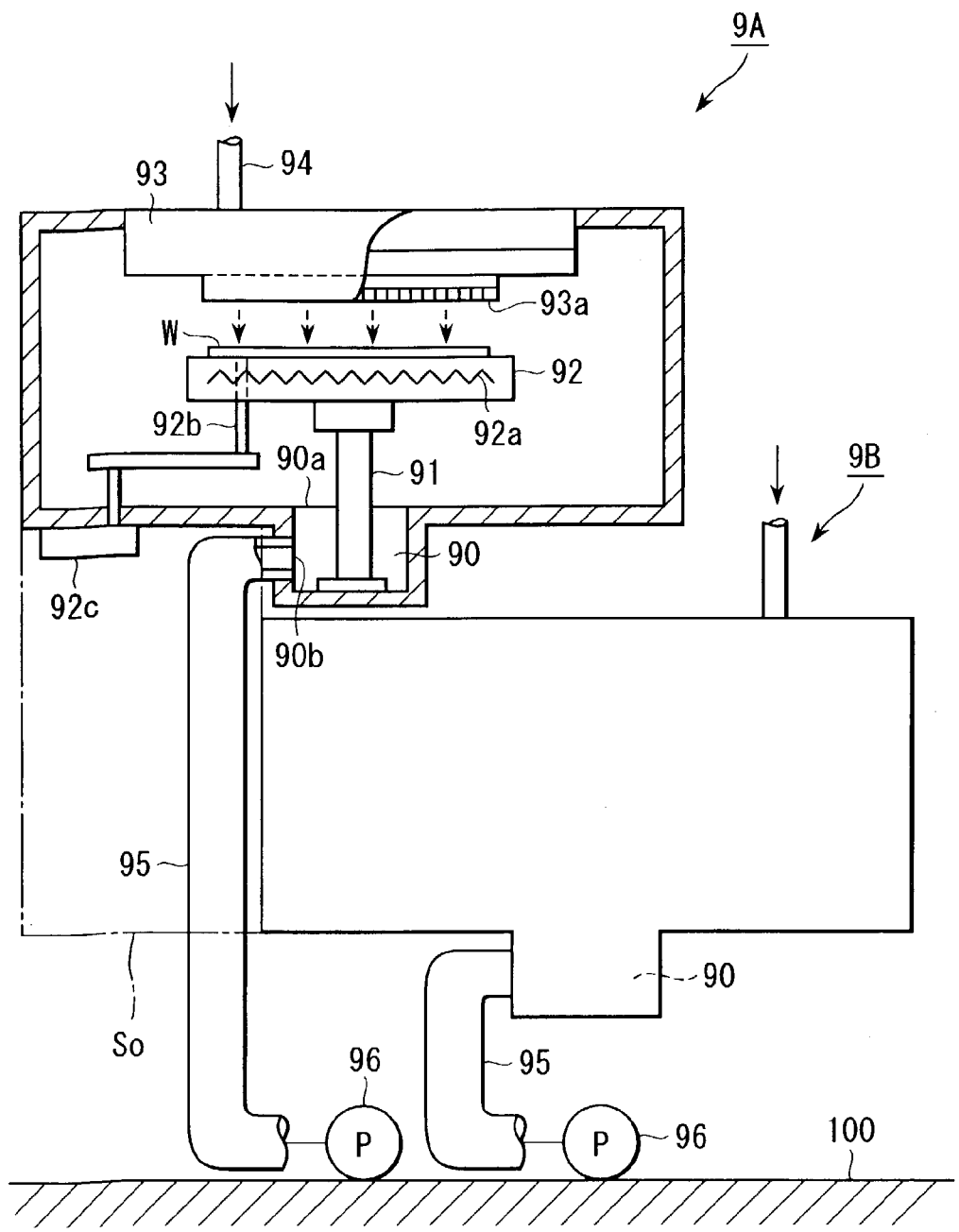
FIG. 11 is a partially cutaway side view showing two process chambers, in a semiconductor processing system according to still another embodiment of the present invention.

FIG. 11 is a partially cutaway side view showing two process chambers, in a semiconductor processing system according to still another embodiment of the present invention. In the embodiment shown in FIG. 11, the group of process chambers connected to each sidewall of a transfer chamber is formed of the same two process chambers 9A and 9B disposed at two height levels. Between the process chambers 9A and 9B, an arbitrary offset is secured in a horizontal direction along the sidewall of the transfer chamber. As a consequence, an offset space So is formed below the process chamber 9A and beside the adjacent sidewall of the process chamber 9B. The offset may be larger than the width of an exhaust line extending from the upper process chamber 9A and smaller than a half of the width of the upper process chamber 9A, as described above.

In the process chamber 9A, a circular worktable 92 is disposed for placing a wafer W thereon. The worktable 92 is provided with an electrostatic chuck (not shown), heater 92a, and thermo-sensor (not shown), as in the worktable 51 shown in FIG. 3. Lifter pins 92b (only one of them is shown in FIG. 11) are provided to be movable up and down through the worktable 92. The lifter pins 92b are connected through a common frame to a driving source 92c, which is fixed to the outside of the bottom of the process chamber 9A.

A showerhead 93 is disposed on the ceiling of the process chamber 9A and faces the worktable 92. The top of the showerhead 93 is connected to a supply section of a reactive gas (for example, TiCl$_4$ gas and NH$_3$ gas for a CVD process) and an inactive gas (for example, nitrogen) through a gas supply line 94. A number of gas delivery holes 93a are formed in the bottom of the showerhead 93, for uniformly supplying gas toward the wafer W.

A recess (gas convergence portion) 90 formed of a part of the casing of the process chamber 9A is disposed at the center of the bottom. The entrance of the recess 90 functions as an exhaust port 90a of the process chamber 9A in effect. A cylindrical column 91 stands from the bottom of the recess 90 and supports the worktable 92. Utility lines (not shown) are led through the column 91 from the inside of the process chamber 9A to the outside.

The recess 90 is provided with an opening 90b formed in the side thereof, which is connected to a vacuum pump 96 of a vacuum exhaust section through an exhaust line 95 having a diameter of, e.g., 30 to 200 mm. The exhaust line 95 is provided with a shutoff valve and auto pressure control (APC) valve (not shown). When the process chamber 9A is supplied with a process gas, the process chamber 9A is also exhausted, while a control section (not shown) opens the shutoff valve and performs adjustment with the APC valve on the exhaust line 95. As a consequence, the atmosphere in the process chamber 9A is kept at a predetermined vacuum level.

The exhaust line 95 extends horizontally from the recess 90 toward the offset space So, and then is bent and extends vertically downward in the offset space So toward the floor of a clean room 100. The exhaust line 95 is bent to be horizontal at a position corresponding to the height of a vacuum pump 96 disposed on the floor of the clean room 100, and then is connected to the vacuum pump 96. The horizontal distance between the center of the worktable 92 (center of the interior wall of the process chamber 9A) and the center of the exhaust line 95 in the plan view is, e.g., 100 to 500 mm.

On the other hand, although the interior structure of the process chamber 9B is not shown, it may be substantially the same as that of the process chamber 9A, or may be a structure for performing another process, such as etching, oxidation, diffusion, or annealing. In the example shown in FIG. 11, however, it is assumed that the process chamber 9B has substantially the same interior structure as that of the process chamber 9A. In this case, the entrance of a recess 90 disposed at the center of the bottom of the process chamber 9B also functions as the exhaust port of the process chamber 9B in effect, as in the exhaust port 90a of the process chamber 9A. The exhaust lines 95 of the process chambers 9A and 9B may be designed to have the same number of bent portions thereon, from their proximal ends to the respective vacuum pumps 96.

In the process chamber 9A shown in FIG. 11, since the exhaust port 90a is located at the center of each of the process chamber, the process chamber can be uniformly exhausted without any baffle plate disposed therein, corresponding to the baffle plate 51a shown in FIG. 3. In this respect, it may be preferable to dispose a member corresponding to the baffle plate 51a around the worktable 92, depending on the process type.

Figure 12:
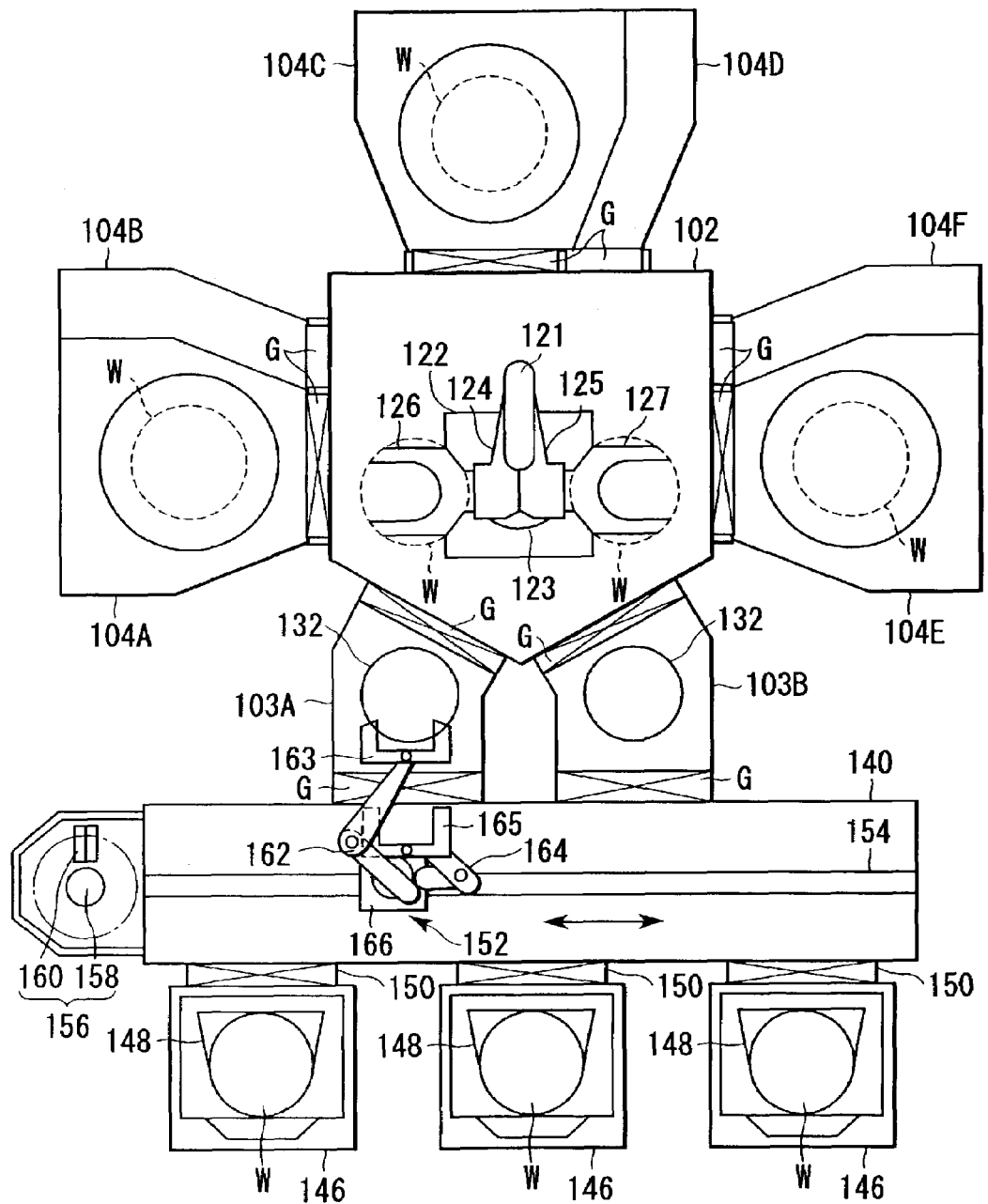
FIG. 12 is a plan view showing a semiconductor processing system according to still another embodiment of the present invention.

FIG. 12 is a plan view showing a semiconductor processing system according to still another embodiment of the present invention. This processing system includes a vacuum transfer chamber 102, which has a pentagonal shape in plan view, and is airtight and pressure-adjustable. Two load lock chambers 103A and 103B, and six vacuum process chambers 104A to 104F are connected to the sidewall of the transfer chamber 102. In the transfer chamber 102, there is a transfer machine 121 for transferring a target substrate or semiconductor wafer W to and from the load lock chambers 103A and 103B, and vacuum process chambers 104A to 104F.

The vacuum process chambers 104A to 104F are arranged to subject a wafer W to a semiconductor process in a vacuum atmosphere, and connected to sidewalls of the transfer chamber 102. Of the process chambers 104A to 104F, a pair of upper and lower process chambers overlap with each other and are disposed on each of three sidewalls of the transfer chamber 102. Since the layout of the process chambers 104A to 104F is the same as that of the process chambers 4A to 4F shown in FIG. 1, no explanation will be given thereof. The layout of the process chambers 104A to 104F may be changed in accordance with the embodiment shown in FIG. 10 or 11.

The transfer machine 121 includes articulated arms 124 and 125, which are rotatable, and movable up and down and back and forth, and a driving mechanism 123 for driving the arms 124 and 125 to perform these movements. The driving mechanism 123 is disposed on an X-Y stage 122 for moving it in horizontal directions. The arms 124 and 125 are provided with picks 126 and 127, respectively, at the distal end, for vacuum-chucking the bottom of a wafer W to hold it horizontally.

Each of the load lock chambers 103A and 103B is connected to a sidewall of the vacuum transfer chamber 102 through a gate valve G on one hand, and is also connected to a sidewall of an I/O transfer chamber 140 through a gate valve G on the other hand. The load lock chambers 103A and 103B are arranged to adjust pressure between the atmospheric pressure and a vacuum. Each of the load lock chambers 103A and 103B has a pre-heating function for pre-heating a wafer and a cooling function for cooling a processed wafer heated by the process. Such a structure is disclosed in Jpn. Pat. Appln. KOKAI Publication No. 2000-208589. In FIG. 12, reference symbol 132 denotes a circular worktable for a wafer W, which is used as a cooling plate as well.

The I/O transfer chamber 140 is formed of a laterally long casing with an atmospheric-pressure atmosphere, in which a down-flow of an inactive gas, such as nitrogen gas, or clean air is formed. On one side of this laterally long casing, one or more, e.g., three in this embodiment, cassette tables 146 are disposed. Each of the cassette tables 146 is structured to place one cassette 148 thereon.

The cassette 148 can accommodate, e.g., 25 wafers at most, with regular intervals therebetween in the vertical direction. The inside of the cassette 148 is formed of an airtight structure filled with, e.g., nitrogen gas. Wafers are transferred between the cassette tables 146 and the I/O transfer chamber 140 through gate doors 150 disposed correspondingly to the cassette tables 146.

In the I/O transfer chamber 140, there is a transfer robot 152 for transferring wafers W in the longitudinal direction of the chamber 140. The transfer robot 152 is slidably supported on a guide rail 154 extending in the longitudinal direction of the I/O transfer chamber 140 at the center. The guide rail 154 is provided with a driving mechanism, such as a linear motor, by which the transfer robot 152 is moved along the guide rail 154.

At one end of the I/O transfer chamber 140, there is an alignment device 156 for positioning a wafer. The alignment device 156 has a rotational table 158, which is rotated by a driving motor (not shown) along with a wafer W placed thereon. An optical sensor 160 for detecting the edge of a wafer W is disposed beside the rotational table 158. Specifically, the optical sensor 160 detects the direction or positional shift of the notch or orientation flat of the wafer W.

The transfer robot 152 has two articulated transfer arms 162 and 164 disposed at two height levels. The transfer arms 162 and 164 are provided with fork picks 163 and 165, respectively, at the distal end, on which a wafer W is directly placed. The transfer arms 162 and 164 are extensible/contractible, and can be independently controlled to perform an extending/contracting action. The transfer arms 162 and 164 are rotated together relative to a base 166.

As described above, the semiconductor processing system according to this embodiment also has a structure in which every two of the process chambers 104A to 104F are paired and set at two height levels, and the pairs of upper and lower process chambers are disposed around the transfer chamber 102. This arrangement greatly improves the space efficiency, and the offset space formed below each of the process chambers makes maintenance operations easier.

The layout features of process chambers and exhaust lines according to the embodiments described above are not limited to a film formation system, but may be applied to another system, such as an RTP system, etching system, sputtering system, or ashing system.

The atmosphere in a transfer chamber during a process can be arbitrarily adjusted in a range of from a vacuum to a pressure higher than the atmospheric pressure. As an atmosphere gas for this, inactive gas, such as nitrogen gas, may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor processing system comprising:
    a pressure-adjustable airtight transfer chamber having a polygonal plan-view contour including first, second, and third planar faces each forming a distinct plane;
    a pressure-adjustable load lock chamber connected to an in/out port, which is formed in the first planar face, through a gate valve, and configured to insert/receive a target substrate into/from the transfer chamber;
    a pressure-adjustable first process chamber connected to a first port, which is formed in the second planar face, through a gate valve, and configured to subject a target substrate to a semiconductor process in a vacuum atmosphere;
    a pressure-adjustable second process chamber connected to a second port, which is formed in the second planar face and shifted in a position from the first port in a first horizontal direction along the second planar face, through a gate valve, and configured to subject a target substrate to a semiconductor process in a vacuum atmosphere, the second process chamber being disposed below the first process chamber and overlapping with the first process chamber as viewed in a vertical direction along the second planar face, and the second process chamber having a center shifted from that of the first process chamber in the first horizontal direction along the second planar face;
    a pressure-adjustable third process chamber connected to a third port, which is formed in the third planar face, through a gate valve, and configured to subject a target substrate to a semiconductor process in a vacuum atmosphere, the third process chamber being disposed at a position laterally distant from the first process chamber, the third port being substantially leveled with the first port or the second port;
    first to third exhaust lines respectively connecting first to third exhaust ports formed in bottoms of the first to third process chambers to corresponding vacuum exhaust sections; and
    a transfer mechanism disposed in the transfer chamber, and configured to transfer a target substrate to and from the load lock chamber and the first to third process chambers,
    wherein an offset space is formed below the first process chamber and beside an adjacent sidewall of the second process chamber, and the first exhaust line extends downward through the offset space,
    the first exhaust port is disposed at a substantial center of the first process chamber, and
    a gas convergence portion is formed below the first exhaust port, and the first exhaust line includes a first portion extending horizontally from the gas convergence portion to the offset space, and a second portion extending downward from the first portion through the offset space.

2. The system according to claim 1, wherein the in/out port is substantially leveled with the first port or the second port.

3. The system according to claim 1, wherein the load lock chamber is configured to accommodate a cassette for storing a plurality of target substrate.

4. The system according to claim 1, wherein the offset space has a width larger than a width of the first exhaust line and smaller than a half of a width of the first process chamber in the first horizontal direction.

5. The system according to claim 1, wherein the first and second process chambers have substantially the same interior structure, and the second exhaust port has a position relative to the second process chamber, substantially the same as that of the first exhaust port relative to the first process chamber.

6. The system according to claim 1, wherein the first process chamber comprises a first supply port disposed on an upper side for supplying a process gas, and a baffle plate disposed between the first supply port and the first exhaust port for making a uniform flow of the process gas.

7. The system according to claim 1, wherein the first and second exhaust lines have the same number of bent portions thereon, from their proximal ends to the corresponding vacuum exhaust sections.

8. The system according to claim 4, further comprising:
a fourth process chamber connected to a fourth port, which is formed in the third planar face, through a gate valve, and configured to subject a target substrate to a semiconductor process in a vacuum atmosphere, the fourth process chamber being disposed below the third process chamber and overlapping with the third process chamber; and
a fourth exhaust line connecting a fourth exhaust port formed in a bottom of the fourth process chamber to a corresponding vacuum exhaust section.

9. The system according to claim 1, wherein each of the first to third process chambers has a worktable on which a target substrate is placed, and a supply port for supplying a process gas from above the worktable.

10. The system according to claim 1, wherein the first and second process chambers respectively defined by independent casings are supported by a common frame.

11. A semiconductor processing system comprising:
a pressure-adjustable airtight transfer chamber having a polygonal plan-view contour including first and second planar faces each forming a distinct plane;
a pressure-adjustable load lock chamber connected to an in/out port, which is formed in the first planar face, through a gate valve, and configured to insert/receive a target substrate into/from the transfer chamber;
a pressure-adjustable first process chamber connected to a first port, which is formed in the second planar face, through a gate valve, and configured to subject a target substrate to a semiconductor process in a vacuum atmosphere;
a pressure-adjustable second process chamber connected to a second port, which is formed in the second planar face and shifted in position from the first port in a first horizontal direction along the second planar face, through a gate valve, and configured to subject a target substrate to a semiconductor process in a vacuum atmosphere, the second process chamber being disposed below the first process chamber and overlapping with the first process chamber as viewed in a vertical direction along the second planar face, and the second process chamber having a center shifted from that of the first process chamber in the first horizontal direction along the second planar face such that a first offset space is formed below the first process chamber and beside an adjacent sidewall of the second process chamber, and has a width larger than a first value and smaller than a half of a width of the first process chamber in the first horizontal direction along the second planar face;
first and second exhaust lines respectively connecting first and second exhaust ports formed in bottoms of the first and second process chambers to corresponding vacuum exhaust sections, the first exhaust line extending downward through the first offset space and having a width of the first value in the first horizontal direction along the second planar face; and
a transfer mechanism disposed in the transfer chamber, and configured to transfer a target substrate to and from the load lock chamber and the first and second process chambers,
wherein the first exhaust port is disposed at a substantial center of the first process chamber, and a gas convergence portion is formed below the firstexhaust port, and the first exhaust line includes a first portion extending horizontally from the gas convergence portion to the first offset space, and a second portion extending downward from the first portion through the first offset space.

12. The system according to claim 11, further comprising:
a pressure-adjustable third process chamber connected to the second planar face through a gate valve, and configured to subject a target substrate to a semiconductor process in a vacuum atmosphere, the third process chamber being disposed below the second process chamber and overlapping with the second process chamber, the third process chamber having a center shifted from that of the second process chamber in the first horizontal direction along the second planar face, such that a second offset space is formed below the second process chamber and beside an adjacent sidewall of the third process chamber, and the second exhaust line extends downward through the second offset space; and
a third exhaust line connecting a third exhaust port formed in a bottom of the third process chamber to a corresponding vacuum exhaust section.

13. The system according to claim 12, wherein the first offset space and the second offset space are formed on sides opposite to each other relative to the center of the second process chamber in the first horizontal direction.

* * * * *